(12) United States Patent
Zhou et al.

(10) Patent No.: US 9,997,209 B2
(45) Date of Patent: Jun. 12, 2018

(54) POWER-FAILURE PROTECTION METHOD AND SOLID STATE DRIVE

(71) Applicant: Shannon Systems Ltd., Shanghai (CN)

(72) Inventors: Zhen Zhou, Shanghai (CN); Xueshi Yang, Cupertino, CA (US)

(73) Assignee: SHANNON SYSTEMS LTD., Shanghai (CN)

( * ) Notice: Subject to any disclaimer, the term of this patent is extended or adjusted under 35 U.S.C. 154(b) by 0 days. days.

(21) Appl. No.: 15/527,538

(22) PCT Filed: Jan. 8, 2015

(86) PCT No.: PCT/CN2015/070349
§ 371 (c)(1),
(2) Date: May 17, 2017

(87) PCT Pub. No.: WO2016/078202
PCT Pub. Date: May 26, 2016

(65) Prior Publication Data
US 2017/0330603 A1    Nov. 16, 2017

(30) Foreign Application Priority Data
Nov. 21, 2014 (CN) .......................... 2014 1 0674388

(51) Int. Cl.
G11C 16/04 (2006.01)
G11C 5/14 (2006.01)
G11C 16/22 (2006.01)

(52) U.S. Cl.
CPC ............ *G11C 5/148* (2013.01); *G11C 16/225* (2013.01)

(58) Field of Classification Search
CPC .............................. G11C 5/148; G11C 16/225
(Continued)

(56) References Cited

U.S. PATENT DOCUMENTS 5,583,715 A * 12/1996 Miura ................... G11B 19/06
360/135
2010/0037001 A1   2/2010 Langlois et al.
(Continued)

FOREIGN PATENT DOCUMENTS

CN          101458668 A     6/2009
CN          101706853 A     5/2010
(Continued)

OTHER PUBLICATIONS

International Search Report dated Aug. 20, 2015, issued in application No. PCT/CN2015/070349.

*Primary Examiner* — Huan Hoang
(74) *Attorney, Agent, or Firm* — McClure, Qualey & Rodack, LLP

(57) ABSTRACT

Provided are a power failure protection method and solid state drive (SSD). The SSD comprises: a power-failure detection device, for monitoring in real time whether the power supply is abnormal; a power-failure protection device performs a power-failure protection operation when the power supply is monitored to be abnormal: breaking a connection with a host system bus, an SSD internal clock breaking from a system bus clock and writing data in the SSD cache into a storage unit of the SSD by using the SSD internal clock. The technical solution ensures completion of the data protection operations by utilizing a remaining capacity, thus ensuring data integrity.

12 Claims, 3 Drawing Sheets

(58) Field of Classification Search
USPC .................................................. 365/185.04
See application file for complete search history.

(56) References Cited

U.S. PATENT DOCUMENTS

| | | |
|---|---|---|
| 2010/0181605 A1 | 7/2010 | Mayya et al. |
| 2012/0151121 A1 | 6/2012 | Bragga |
| 2013/0205065 A1 | 8/2013 | Kloeppner et al. |
| 2013/0212321 A1 | 8/2013 | Talagala et al. |

FOREIGN PATENT DOCUMENTS

| | | |
|---|---|---|
| CN | 101826060 A | 9/2010 |
| CN | 102156679 A | 8/2011 |
| CN | 103262054 A | 8/2013 |

* cited by examiner

POWER-FAILURE PROTECTION METHOD AND SOLID STATE DRIVE

FIELD OF THE INVENTION

The invention relates to a computer security technology, and more particularly to a power-failure protection method and a solid-state disk.

BACKGROUND

Based on rapid development of flash (NAND flash) data storage technology in the past ten years, flashes gradually replace the traditional magnetic hard drive (hard disk drive, HDD) in many applications. Compared with traditional hard disk-based storage systems, protection for power-failure situations occurred in SSDs (solid-state drives) is significantly different, and there are inherent advantages and inherent disadvantages. Since there is no mechanical portion, there is no problem of emergent parking of magnetic heads. However, there is more complex metadata and data cache in SSDs. Thus, SSDs have to ensure that data can be written into media to guarantee integrity of metadata and user data. For enterprise applications, the following requirements are needed to guarantee that: 1, after SSDs are restarts due to power interruption, they must operate normally; and 2, all data which has been written must be read out correctly.

In a traditional SSD system, a controller is implemented by an embedded processor and firmware. The controller is fragile when the power is interrupted or when the host restarts suddenly. In order to guarantee that the processor can operate normally until metadata and data can be stored in media completely, a long time is usually taken for the operation of the processor. Thus, a battery or super-capacitor is needed to provide the required power. If the battery itself is failed, the vulnerability of the system becomes more series. Some SSD systems do not have any protection mechanism, and their security is inherently low.

Thus, how to guarantee the integrity of system data when the power is failed becomes the issue for to those skilled in the art.

BRIEF SUMMARY OF THE INVENTION

In view of the foregoing disadvantages of the prior art, an object of the present invention is to provide a power-failure protection method and a solid-state disk to solve the problem of incomplete data caused by the abnormal power failure in the prior art.

To achieve the above objects and other objects, the present invention provides a power-failure protection method. The power-failure protection method comprises steps of: monitoring a power supply in real time; when it is monitored that the power supply is abnormal, a device controller logically breaking a connection with a system bus, and a device internal clock breaking from a system bus clock and entering a free operation; and the device controller completing a data-related operation using the device internal clock.

Alternatively, the data-related operation comprises writing data in a device cache into a device storage unit.

Alternatively, valid data in the device cache is filled until a writing unit boundary is reached, and the filled data is written to a device storage unit.

Alternatively, the step of monitoring the power supply comprises: detecting whether a voltage of the power supply is in a predetermined range, and determining that the power supply is normal and activating a power-failure protection writing operation when the voltage of the power supply is not in the predetermined range.

Alternatively, the step of monitoring the power supply comprises: detecting a reset signal on the system bus, and determining that the power supply is abnormal and activating a power-failure protection writing operation when the reset signal is detected to be valid.

Alternatively, the power-failure protection method further comprises: when the power supply is monitored to be restored, the device controller being restored to operate normally.

The present invention also provides a solid-state hard drive. The solid-state hard drive comprises a power-failure detection device for monitoring whether a power supply in real time; a power-failure detection device for, when the power supply is monitored to be abnormal, performing a power-failure protection operation comprising: breaking a connection with a system bus, an internal clock of the solid-state hard drive breaking from a system bus clock and entering a free operation; and writing data in a cache of the solid-state hard drive into a storage unit of the solid-state hard drive by using the internal clock of the solid-state hard drive.

Alternatively, the power-failure detection device detects whether a voltage of the power supply is in a predetermined range. When the voltage of the power supply is not in the predetermined range, the power supply is abnormal.

Alternatively, the power-failure detection device detects a reset signal on the system bus, and when the power-failure detection device detects that the reset signal is valid, the power supply is abnormal.

Alternatively, valid data in the cache of the solid-state hard drive is filled until a writing unit boundary is reached, and the filled data is written to a device storage unit.

Alternatively, the solid-state hard drive further comprises a power-failure restoring device, and the power-failure restoring device restores the solid-state drive to a normal operation when the power supply is detected to be restored.

The present invention further provides a computing device. The computing device comprises the above solid-state hard drive. When a power supply is abnormal, the solid-state drive hardware performs following operations logically: breaking a connection with a system bus; all of control processors emptying pipelines; the solid-state drive completing a power-failure protection operation, and turning off all of the control processors.

The power-failure protection method and the solid-state drive of the invention cause the following effects: 1, using remaining capacity without any battery; 2, guaranteeing accurate detection for various abnormal situations; 3, guaranteeing the completion of the protection operation in real time and in sequence; and 4, implementing all the operations by hardware without any software to enhance the robustness.

THE MAJOR SYMBOL DESCRIPTION 1 solid-state hard drive
11 power-failure detection device

12 power-failure protection device

S1~S3 steps

DETAILED DESCRIPTION

The embodiments of the invention are described through the following specific samples. One skilled in the art can easily understand the advantages and efficacy of the invention. The invention can be implemented or applied through other embodiments. The various details of the specification can be modified or changed based on different aspects or applications without departing from the spirit of the invention.

It should be noted, the drawings provided in the embodiment are used to schematically illustrate the basic idea of the invention. The drawings are not drawn according to the actual number of components, the actual shapes of the components, and the actual size of the components. The drawings show only the components related to the invention. When the invention is implemented in practice, the types and ratios of the components and the number of the components can be changed, and the component layout may be more complex.

Figure 1:
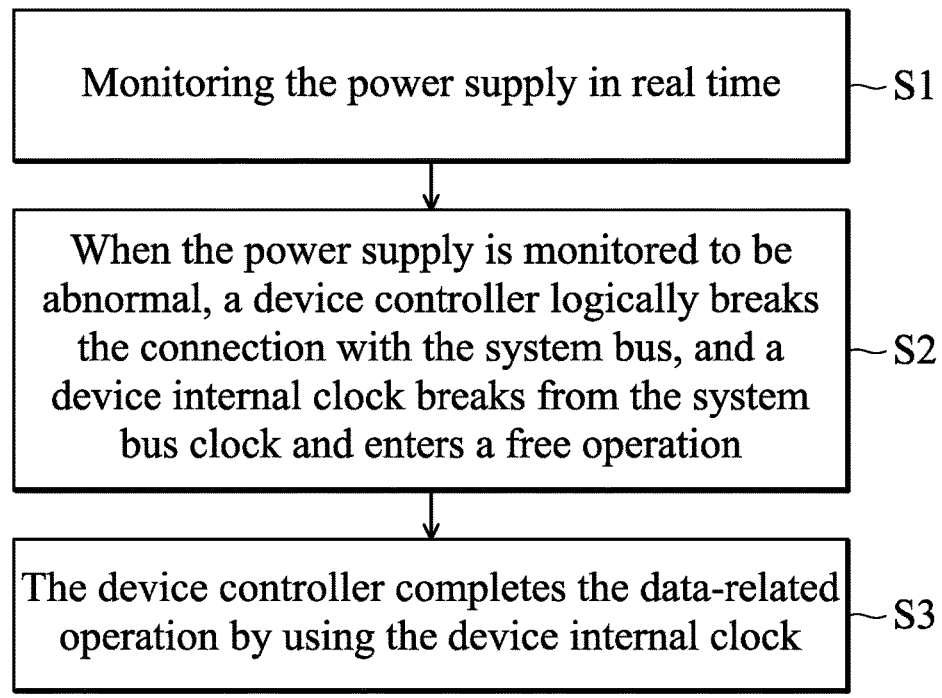
FIG. 1 shows a flow diagram of an embodiment of the power-failure protection method.

The present invention provides a power-failure method. The power-failure method can guarantee the completion of the protection operation by using the remaining capacity. In servers and general computers, a power supply is implemented by a switching power supply with the appropriate power. In cases where the power is failed suddenly, the power storing in a part of capacitors and a part of inductors can keep the computers operating for a short time. That power is considered as "remaining capacity". For a power supply of a high-quality computer, remaining capacity can the computer operating for 20 milliseconds or even longer, which is determined by the characteristic of the power supply circuit. In an exemplary embodiment, as shown in FIG. 1, the provided power-failure method comprises:

Step S1: monitoring a power supply in real time. The embodiment of the step of monitoring the power supply in real time comprises: detecting whether the voltage of the power supply is in a predetermined range. When the voltage of the power supply is in the predetermined range, the power supply is normal. When the voltage of the power supply is not in the predetermined range, the power supply is abnormal. The embodiment of the step of monitoring the power supply in real time further comprises: detecting the reset signal on the system bus of the host. When the reset signal is detected to be valid, the power supply is determined to be abnormal, and a power-failure protection writing operation is activated. One of the above detection manners can support for the other and further be a backup of the other. In an embodiment, the step of detecting whether the voltage of the power supply is in the predetermined range and the step of detecting the reset signal on the system bus of the host are performed simultaneously. When the voltage of the power supply is not in the predetermined range or when the reset signal is detected to be valid, the power supply is determined to be abnormal, and the power-failure protection writing operation is activated. Only when the voltage of the power supply is in the predetermined range and no reset signal is detected on the system bus of the host, the power supply is normal. The case where the power supply is abnormal represents one of occurrences of the following situations: 1, the power supply will be lost and has begun to decline; 2, the power supply will be lost but has not begun to decline, however, the host system has detected that the switch enters the shutdown process; and 3, the power supply is normal, but the system begins to restart due to other reasons, such as the system software crashes or the system hardware is broken down.

Step S2: when the power supply is monitored to be abnormal, a device controller logically breaks the connection with the system bus, and a device internal clock breaks from the system bus clock and enters a free operation. In cases where the step is applied for a storage device, when the controller of the storage device breaks from the system bus, the controller of the storage device does not receive any host data or transmit any data to the host. When the system bus clock breaks from the phase lock loop (PLL) of the internal clock of the storage device, the PLL, enters a free operation, and the internal clock can maintain relatively stable operation about 10 milliseconds.

Step S3: the device controller completes the data-related operation by using the device internal clock. Specifically, in cases where the step is applied for a storage device, the data-related operation comprises the operation of writing the data of the cache of the storage device into the storage unit of the storage device. Further, the valid data in the device cache is filled until the writing unit boundary is reached, and then the filled data is written to the device storage unit. The metadata refers to the data related to data structure which is maintained for achieving flash conversion in a flash.

In an embodiment, the power-failure protection method further comprises the step: when the power supply is monitored to be restored, the device controller is restored to operate normally. Specifically, the case where, after the power supply is monitored to be abnormal, the power supply is monitored to be restored before the system is shut down represents that the system is restored and the device controller is also restored to operate normally. Only the case where the voltage of the power supply is in the predetermined range and no reset signal is detected on the system bus represents the power supply is restored to be normal. The power-failure protection method provided by the invention can be applied not only for solid-state drives (SSDs), but also for other systems which require power-failure protection.

Figure 2:
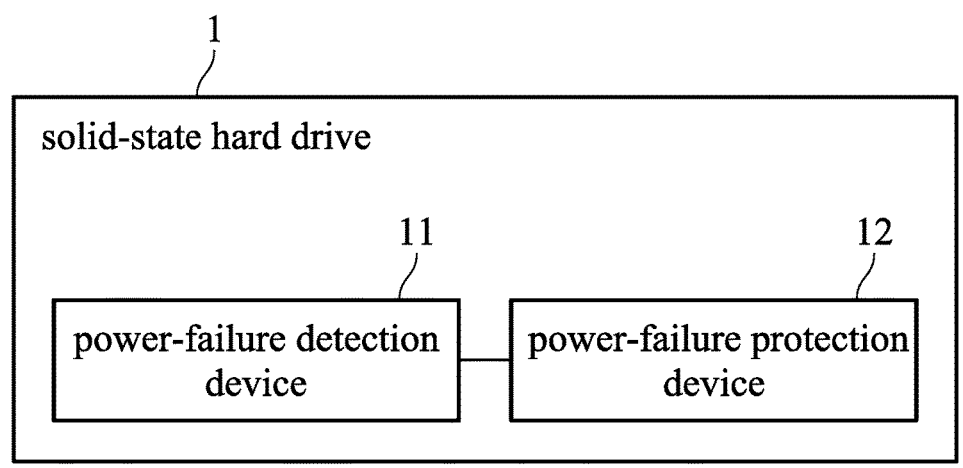
FIG. 2 shows an embodiment of invention solid-state drive.

The present invention also provides a solid-state drive. In an embodiment, as shown in FIG. 2, in addition to necessary components, the solid-state hard drive 1 also comprises a power-failure detection device 11 and a power-failure protection device 12.

Figure 3:
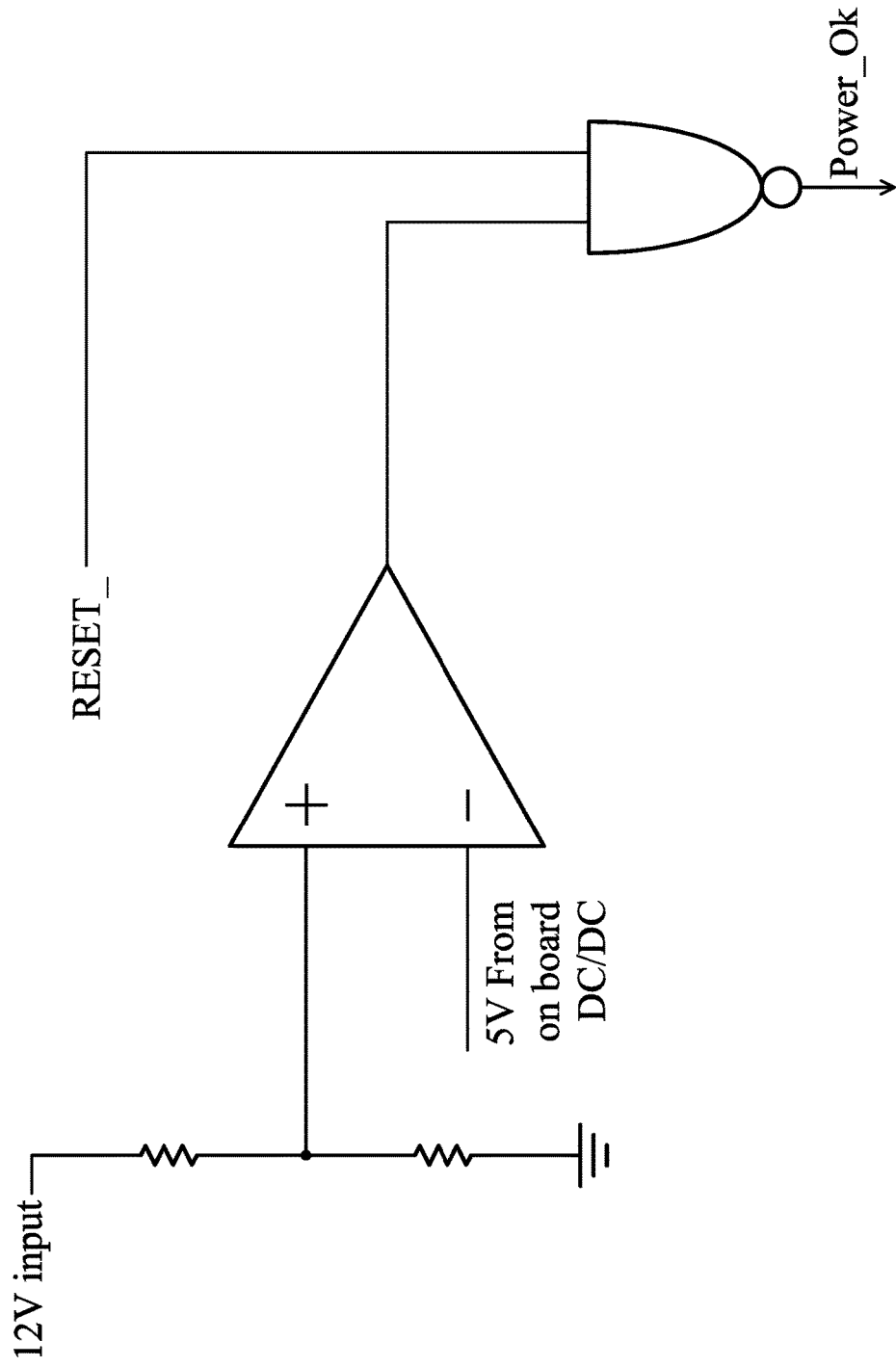
FIG. 3 shows a schematic diagram of a partial circuit of an embodiment of an SSD.

The power-failure detection device 11 is used to monitor a power supply in real time. The operation for monitoring the power supply in real time can be achieved by: detecting whether the voltage of the power supply is in a predetermined range. When the voltage of the power supply is in the predetermined range, the power supply is normal. When the voltage of the power supply is not in the predetermined range, the power supply is abnormal. The operation for monitoring the power supply in real time can be further achieved by: detecting the reset signal on the system bus of the host. When the reset signal is detected to be valid, the power supply is determined to be abnormal One of the above detection manners can support for the other and further be a backup of the other. In an embodiment, the power-failure detection device 11 detects whether the voltage of the power supply is in the predetermined range and detects the reset signal on the system bus of the host simultaneously. When the voltage of the power supply is not in the predetermined range or when the reset signal RESET_ is detected to be valid, the power supply is abnormal. Only when the voltage of the power supply is in the predetermined range and no reset signal RESET_ is detected on the system bus of the host, the power supply is normal. The case where the power supply is abnormal represents one of occurrences of the following situations: 1, the power supply will be lost and has begun to decline; 2, the power supply will be lost but has not begun to decline, however, the host system has detected that the switch enters the shutdown process; and 3, the power supply is normal, but the system begins to restart due to other reasons, such as the system software crashes or the system hardware is broken down. In an embodiment, a part of the circuit of the power-failure detection device 11 is shown in FIG. 3 and applied for outputting a low-level signal by a simple voltage comparator which when the voltage decreases to 10V from 12V and detecting the reset signal on the detection PCIE bus, that is the reset signal RESET_ shown in FIG. 3.

The power-failure protection device 12 is coupled to the power-failure detection device 11. When the power supply is detected to be abnormal, the power-failure protection device 12 performs the following power-failure protection operation logically: breaking the connection with the system bus. An internal clock of the solid-state drive breaks from the system bus clock and enters a free operation. By using the internal clock of the solid-state drive, the data in the cache of the solid-state drive is written into the storage unit of the solid-state drive. In an embodiment, the valid data in the cache of the solid-state drive is filled until the writing unit boundary is reached, and then the filled data is written to the storage unit.

In an embodiment, the solid-state drive 1 further comprises a power-failure restoring device. The power-failure restoring device is used to restore the solid-state drive to the normal operation when the power supply is monitored to be restored. Specifically, the case where, after the power-failure detection device 11 monitors that the power supply is abnormal, the power-failure detection device 11 monitors that the power supply is restored before the system is shut down represents that the system is restored. The power-failure restoring device restores the solid-state drive to the normal operation. Only the case where the voltage of the power supply is in the predetermined range and the reset signal RESET_ is not detected on the system bus represents the power supply is restored to be normal A computing device is provided. The computing device comprises the solid-state drive 1. When the power supply is abnormal, the computing device performs the following operations logically: breaking the connection with the system bus; all the control processors emptying the pipelines; and the solid-state drive completing the power-failure protection operation, turning off all the control processors. In an embodiment, when the power supply is abnormal, the following operations are performed logically: 1, the SSD controller breaks the connection with the system bus, so that the SSD controller does not receive any host data or transmit any data to the host; 2, the system bus clock breaks from the internal PLL, the PLL enters a free operation, and the internal clock can maintain relatively stable operation about 10 milliseconds; 3, all the control processors emptying the pipelines; 4, if there is still valid data in the cache, the sector boundary is defined, the remaining user data is filled by 0, and the metadata is filled by 1; 5, the data in the cache is written into the flash; and 6. All the processor are turned off.

In an embodiment, after the power supply is abnormal in the computing device, if the power supply is monitored to be restored (that is, the signal RESET_ on the system bus is restored to the high level), the system bus is restored to be normal, and the SSD is restored to operate normally.

According to the above embodiments, the power-failure protection method and the solid-state drive of the invention can accomplish the following: 1, detecting the power supply and the signal RESET_ to detect that the power supply is abnormal; 2, performing the protection operation by using the remaining capacity and free clock; and 3, the protection operation is performed by hardware. The power-failure protection method and the solid-state drive of the invention cause the following effects: 1, using remaining capacity without any battery; 2, guaranteeing accurate detection for various abnormal situations; 3, guaranteeing the completion of the protection operation in real time and in sequence; and 4, implementing all the operations by hardware without any software to enhancing the robustness. Thus, the invention overcomes the problems of the current techniques and has high industrial utility value.

While the principles and efficacy of the invention has been described by way of example of the preferred embodiments, it is to be understood that the invention is not limited to the disclosed embodiments. One skilled in the art can modify or change the above embodiment without departing from the spirit and scope of the invention. Therefore, the scope of the appended claims should be accorded the broadest interpretation so as to encompass all such modifications and similar arrangements which are made by one skilled in the art without departing from the spirit and scope of the invention.

The invention claimed is:

1. A power-failure protection method for a device controller, characterized in that the power-failure protection method comprises:
    monitoring a power supply in real time;
    when it is monitored that the power supply is abnormal, breaking a connection with a system bus by the device controller, so that a device internal clock is isolated from a system bus clock and enters a free operation; and
    completing a data-related operation using the device internal clock by the device controller.

2. The power-failure protection method as claimed in claim 1, characterized in that the data-related operation comprises writing data in a device cache into a device storage unit.

3. The power-failure protection method as claimed in claim 2, characterized in that valid data in the device cache is filled until a writing unit boundary is reached, and the filled data is written to a device storage unit.

4. The power-failure protection method as claimed in claim 1, characterized in that the step of monitoring the power supply comprises: detecting whether a voltage of the power supply is in a predetermined range; and determining that the power supply is normal and activating a power-failure protection writing operation when the voltage of the power supply is not in the predetermined range.

5. The power-failure protection method as claimed in claim 1, characterized in that the step of monitoring the power supply comprises: detecting a reset signal on the system bus and determining that the power supply is abnormal and activating a power-failure protection writing operation when the reset signal is detected to be valid.

6. The power-failure protection method as claimed in claim 1, characterized in that the power-failure protection method further comprises: when the power supply is monitored to be restored, the device controller being restored to operate normally.

7. A solid-state hard drive, characterized in that the solid-state hard drive comprises: a power-failure detection device monitoring whether a power supply is abnormal in real time; and a power-failure protection device, when the power supply is monitored to be abnormal, performing a power-failure protection operation comprising: breaking a connection with a system bus, a device internal clock of the solid-state hard drive breaking from a system bus clock and entering a free operation; and writing data in a cache of the solid-state hard drive into a storage unit of the solid-state hard drive by using the internal clock of the solid-state hard drive.

8. The solid-state hard drive as claimed in claim 7, characterized in that the power-failure detection device detects whether a voltage of the power supply is in a predetermined range, and when the voltage of the power supply is not in the predetermined range, the power supply is abnormal.

9. The solid-state hard drive as claimed in claim 7, characterized in that the power-failure detection device detects a reset signal on the system bus, and when the power-failure detection device detects that the reset signal is valid, the power supply is abnormal.

10. The solid-state hard drive as claimed in claim 7, wherein valid data in the cache of the solid-state hard drive is filled until a writing unit boundary is reached, and the filled data is written to a device storage unit.

11. The solid-state hard drive as claimed in claim 7, characterized in that the solid-state hard drive further comprises a power-failure restoring device, and the power-failure restoring device restores the solid-state drive to a normal operation when the power supply is detected to be restored.

12. A computing device, characterized in that the computing device comprises a solid-state hard drive as claimed in claim 7, and when a power supply is abnormal, the solid-state hard drive performs following operations logically: breaking a connection with a system bus; all of control processors emptying pipelines, the solid-state drive completing a power-failure protection operation, and turning off all of the control processors.

* * * * *